(12) United States Patent
Xia

(10) Patent No.: US 8,264,052 B2
(45) Date of Patent: Sep. 11, 2012

(54) SYMMETRIC STT-MRAM BIT CELL DESIGN

(75) Inventor: William Xia, San Diego, CA (US)

(73) Assignee: QUALCOMM Incorporated, San Jose, CA (US)

( * ) Notice: Subject to any disclaimer, the term of this patent is extended or adjusted under 35 U.S.C. 154(b) by 384 days.

(21) Appl. No.: 12/200,161

(22) Filed: Aug. 28, 2008

(65) Prior Publication Data
US 2010/0054027 A1 Mar. 4, 2010

(51) Int. Cl.
*H01L 29/82* (2006.01)
(52) U.S. Cl. ......... 257/421; 257/E21.665; 257/E43.001; 438/3
(58) Field of Classification Search .............. 257/421, 257/E43.001, E21.665; 438/3
See application file for complete search history.

(56) References Cited

U.S. PATENT DOCUMENTS

| | | | |
|---|---|---|---|
| 6,670,660 B2 * | 12/2003 | Hosotani | 257/295 |
| 7,205,598 B2 * | 4/2007 | Voshell et al. | 257/301 |
| 7,362,607 B2 * | 4/2008 | Motoyoshi | 365/158 |
| 2006/0083054 A1 | 4/2006 | Jeong | |
| 2007/0091674 A1 * | 4/2007 | Park et al. | 365/171 |
| 2009/0303779 A1 * | 12/2009 | Chen et al. | 365/158 |

FOREIGN PATENT DOCUMENTS
JP 2008147437 6/2008

OTHER PUBLICATIONS

International Search Report and Written Opinion—PCT/US09/054760, International Searching Authority—European Patent Office, Nov. 4, 2009.
Hosomi, M. et al.: "A novel nonvolatile memory with spin torque transfer magnetization switching: Spin-RAM," in IEEE International Electron Devices Meeting (IEDM) Technical Digest, Dec. 5, 2005, pp. 459-462.

* cited by examiner

*Primary Examiner* — Trung Dang
(74) *Attorney, Agent, or Firm* — Michelle Gallardo; Nicholas J. Pauley; Jonathan T. Velasco

(57) ABSTRACT

A symmetric Spin Transfer Torque Magnetoresistive Random Access Memory (STT-MRAM) bit cell and STT-MRAM bit cell array are disclosed. The STT-MRAM bit cell includes a poly silicon layer, a magnetic tunnel junction (MTJ) storage element, and a bottom electrode (BE) plate. The storage element and bottom electrode (BE) plate are symmetric along a center line of the poly silicon layer.

25 Claims, 7 Drawing Sheets

SYMMETRIC STT-MRAM BIT CELL DESIGN

FIELD OF DISCLOSURE

Exemplary embodiments of the invention are directed to structural designs of Magnetoresistive Random Access Memory (MRAM) bit cells and MRAM bit cell arrays. More particularly, embodiments of the invention are related to structural designs of symmetric Spin Transfer Torque Magnetoresistive Random Access Memory (STT-MRAM) bit cells and STT-MRAM bit cell arrays, and methods of forming STT-MRAM bit cells and STT-MRAM bit cell arrays.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

Referring to FIG. 1, a diagram of a conventional STT-MRAM cell 100 is illustrated. The STT-MRAM bit cell 100 includes magnetic tunnel junction (MTJ) storage element 105, transistor 110, bit line 120 and word line 130. The MTJ storage element is formed, for example, from a pinned layer and a free layer, each of which holds a magnetic field in an example, separated by an insulating (tunnel barrier) layer as illustrated in FIG. 1. The STT-MRAM bit cell 100 also includes a source line 140, sense amplifier 150, read/write circuitry 160 and bit line reference 170. Those skilled in the art will appreciate the operation and construction of the memory cell 100 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

Conventional magnetic tunnel junction (MTJ) bit cell designs are non-symmetric. That is, the MTJ and hexagonal bottom electrode (BE) plate are not symmetric along the center line of the poly silicon. The MTJ seed, contact, and vias are also not centered. In an example, the non-symmetric design of conventional MTJ bit cells makes it more difficult to design MTJ array structures and/or less area efficient. In an example, the non-symmetric design of conventional MTJ bit cells is a limiting factor in reducing bit cell size. In an example, the non-symmetric design of conventional MTJ bit cells also potentially increases the mismatch in the MTJ pairs, especially when a source line (SL) is parallel to a bit line.

SUMMARY

Exemplary embodiments of the invention are directed to structural designs of Magnetoresistive Random Access Memory (MRAM) bit cells and MRAM bit cell arrays. More particularly, embodiments of the invention are related to structural designs of symmetric Spin Transfer Torque Magnetoresistive Random Access Memory (STT-MRAM) bit cells and STT-MRAM bit cell arrays.

Exemplary embodiments are directed to systems and methods for creating a symmetric design of an MTJ bit cell. That is, the MTJ and hexagonal BE plate are symmetric along a center line of the poly silicon. The center of the MTJ seed, contact, and vias are matched.

For example, in an exemplary embodiment, a symmetric Spin Transfer Torque Magnetoresistive Random Access Memory (STT-MRAM) bit cell includes a poly silicon layer, a storage element, and a bottom electrode (BE) plate. The storage element and bottom electrode (BE) plate are symmetric along a center line of the poly silicon layer.

In another exemplary embodiment, a symmetric Spin Transfer Torque Magnetoresistive Random Access Memory (STT-MRAM) bit cell array includes a source line, and a plurality of STT-MRAM bit cells arranged on a longitudinal axis that is perpendicular to a longitudinal axis of the source line and on opposite sides of the source line. The plurality of STT-MRAM bit cells are symmetrically arranged with respect to the source line. Each of the STT-MRAM bit cells includes a poly silicon layer, a magnetic tunnel junction (MTJ) storage element, and a bottom electrode (BE) plate. The storage element and bottom electrode (BE) plate are symmetric along a center line of the poly silicon layer.

In yet another exemplary embodiment, a method of forming a symmetric Spin Transfer Torque Magnetoresistive Random Access Memory (STT-MRAM) bit cell array includes forming a plurality of STT-MRAM bit cells arranged on a longitudinal axis that is perpendicular to a longitudinal axis of a source line and on opposite sides of the source line such that the plurality of STT-MRAM bit cells are symmetrically arranged with respect to the source line. Each of the STT-MRAM bit cells includes a poly silicon layer, a magnetic tunnel junction (MTJ) storage element, and a bottom electrode (BE) plate. The storage element and bottom electrode (BE) plate are symmetric along a center line of the poly silicon layer.

In another exemplary embodiment, a symmetric MTJ bit cell design, in which the MTJ storage element and hexagonal bottom electrode (BE) plate are symmetric along a center line of the poly silicon, and the center of the MTJ seed, contact, and vias are matched, which makes the design of a STT-MRAM bit cell array (e.g., MTJ array) structure easier because of the symmetry, in an example. In another example, the exemplary symmetric MTJ bit cell design also is more area efficient, and/or is used to reduce average MTJ cell sizes. In another example, the exemplary symmetric design also reduces the mismatch of the paired MTJ bit cells. Therefore, the MTJ resistance distribution is improved, in an example.

In another example, at least one exemplary embodiment also makes the design of an MTJ array structure, such as a large array, easier and/or more area efficient and/or is effective for reducing average MTJ cell sizes. In another example, the exemplary symmetric MTJ bit cell design also reduces mismatch in the MTJ pairs and improves MTJ resistance distribution, particularly in array designs in which a source line (SL) is parallel to a bit line.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

With reference to FIGS. 2-7, exemplary embodiments of a symmetric Spin Transfer Torque Magnetoresistive Random Access Memory (STT-MRAM) bit cell and STT-MRAM bit cell array, and method of forming the same, will be described. The ordinarily skilled artisan will recognize that some of the elements illustrated in FIGS. 2-7 are shaded for clarification purposes only, and are not intended to limit the elements to any particular material, etc.

Figure 1:
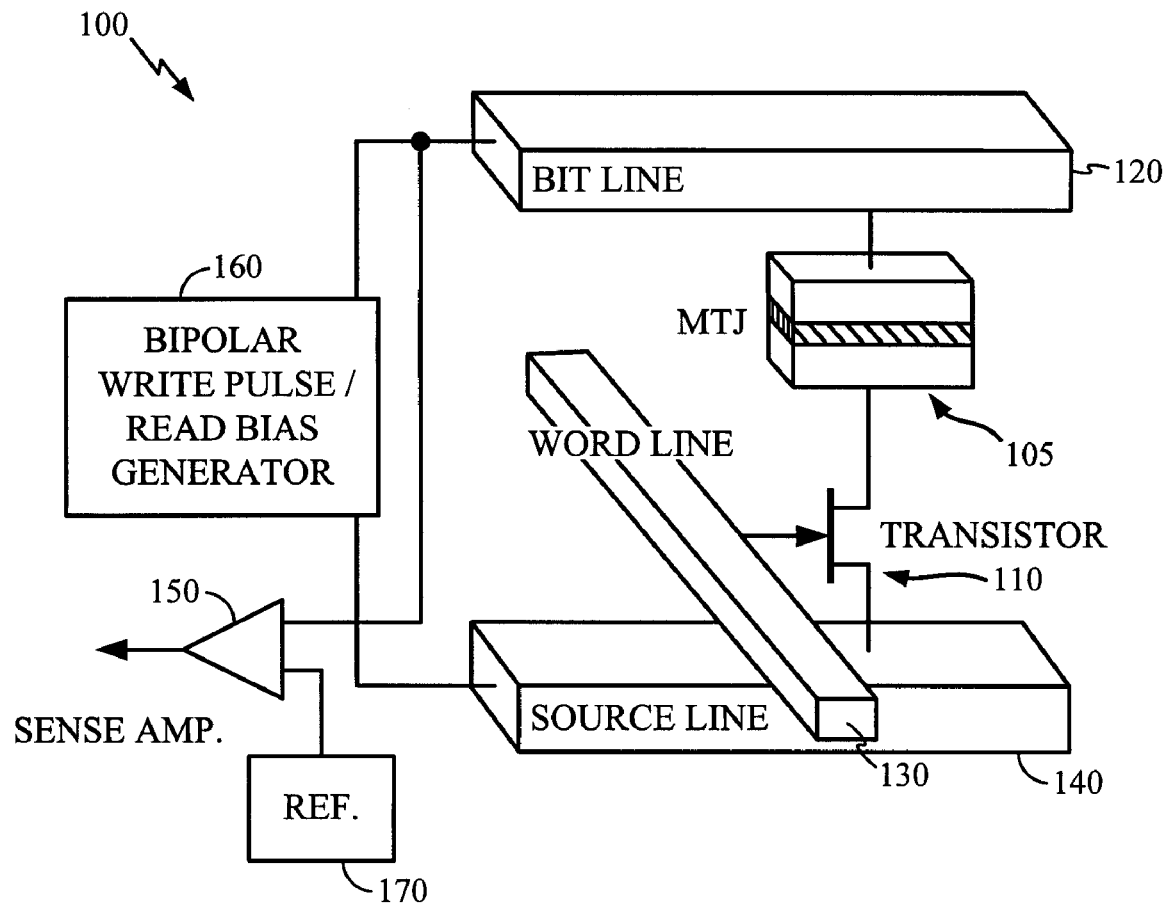
FIG. 1 illustrates a conventional Spin Transfer Torque Magnetoresistive Random Access Memory (STT-MRAM) cell array.
Figure 2:
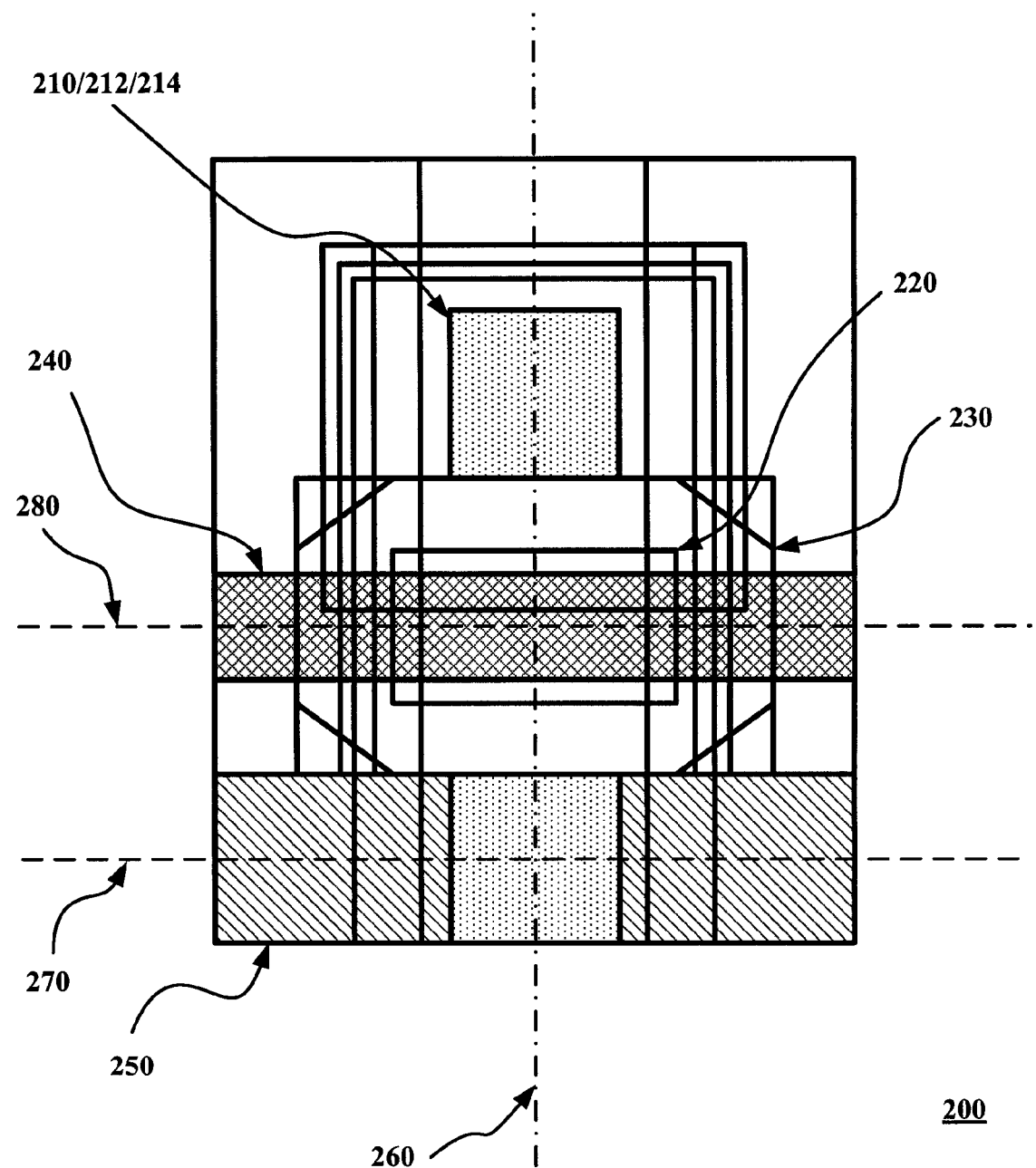
FIG. 2 is a top partial view of a symmetric STT-MRAM bit cell design.

FIG. 2 shows a symmetric Spin Transfer Torque Magnetoresistive Random Access Memory (STT-MRAM) bit cell 200 according to an illustrative embodiment of the invention. For example, the exemplary STT-MRAM bit cell 200 includes a poly silicon layer 240, a storage element 220, and a bottom electrode (BE) plate 230. The storage element 220 and bottom electrode (BE) plate 230 are symmetric along a center line 280 of the poly silicon layer 240.

Referring to FIG. 2, the example a symmetric Spin Transfer Torque Magnetoresistive Random Access Memory (STT-MRAM) bit cell 200 may be arranged with a source line 250 extending along a longitudinal axis 270, parallel to the center line 280 of the poly silicon layer 250, and with a storage element seed 210, a contact 12 and a via interconnect 214. As also shown FIG. 2, the storage element 220 and bottom electrode (BE) plate symmetric along a longitudinal axis 260 that is perpendicular to the center line 280 of the poly silicon layer 240, as described in greater detail below in reference to FIGS. 3-6.

As also shown in FIG. 2, in an exemplary embodiment, the bottom electrode 230 is a hexagonal bottom electrode and the storage element 220 is a magnetic tunnel junction (MTJ) storage element. The exemplary STT-MRAM bit cell 200 also includes a word line (not shown) and a word line transistor (not shown) coupled to the storage element. In an example, the word line transistor (not shown) is coupled in series with the MTJ storage element 220.

Figure 3:
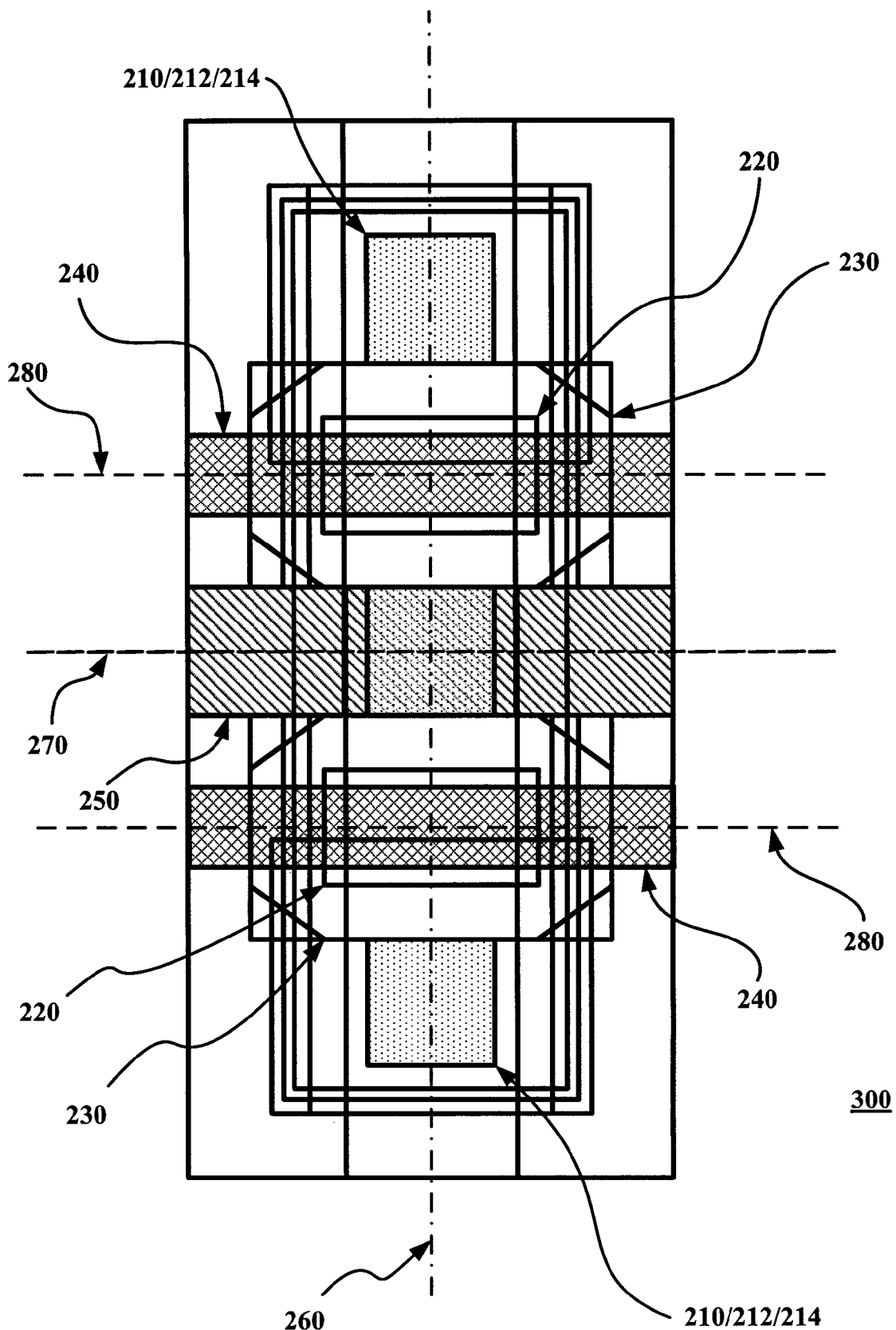
FIG. 3 is a top down view of a symmetric STT-MRAM bit cell array design.
Figure 4:
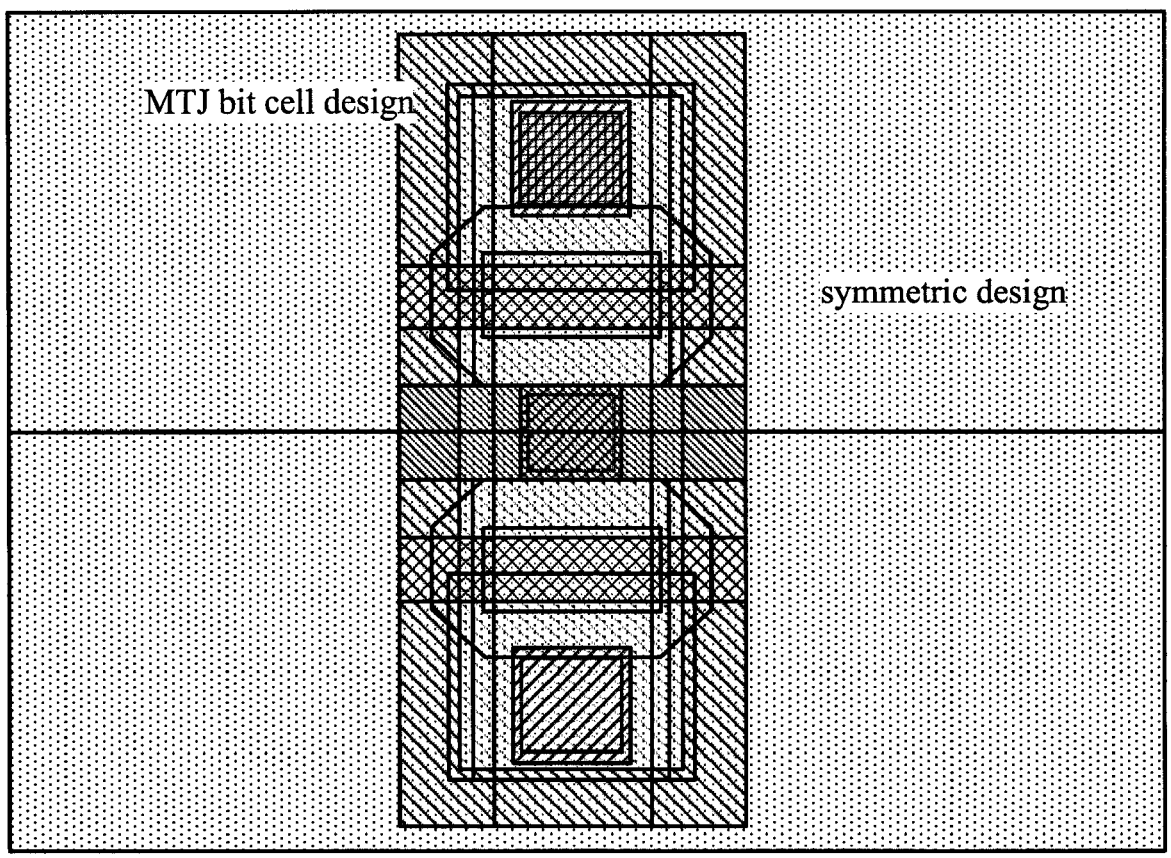
FIG. 4 is an illustration of a symmetric STT-MRAM bit cell array design.

FIG. 3 shows an exemplary embodiment of a symmetric Spin Transfer Torque Magnetoresistive Random Access Memory (STT-MRAM) bit cell array 300. FIG. 4 is a screen shot of the symmetric Spin Transfer Torque Magnetoresistive Random Access Memory (STT-MRAM) bit cell array 300.

For illustrative purposes, FIG. 3 shows a pair of STT-MRAM bit cells 200 that are symmetrically arranged with respect to the source line 250. The STT-MRAM bit cell array 300 includes a source line 250 and a plurality of STT-MRAM bit cells 200. As shown in FIG. 3, each of the STT-MRAM bit cells 200 is arranged on a longitudinal axis 260 that is perpendicular to a longitudinal axis 270 of the source line 250 and on opposite sides of the source line 250. The plurality of STT-MRAM bit cells 200 are symmetrically arranged with respect to the source line 250. The STT-MRAM bit cells include a storage element seed, a contact, and a via interconnect 210/212/214. In another exemplary embodiment, the center point of each of the storage element seed, the contact, and the via interconnect 210/212/214 also are matched.

For example, an embodiment of a symmetric Spin Transfer Torque Magnetoresistive Random Access Memory (STT-MRAM) bit cell array includes a source line, and a plurality of STT-MRAM bit cells arranged on a longitudinal axis that is perpendicular to a longitudinal axis of the source line and on opposite sides of the source line. The plurality of STT-MRAM bit cells are symmetrically arranged with respect to the source line. Each of the STT-MRAM bit cells includes a poly silicon layer, a magnetic tunnel junction (MTJ) storage element, and a bottom electrode (BE) plate. The storage element and bottom electrode (BE) plate are symmetric along a center line of the poly silicon layer.

Figure 5:
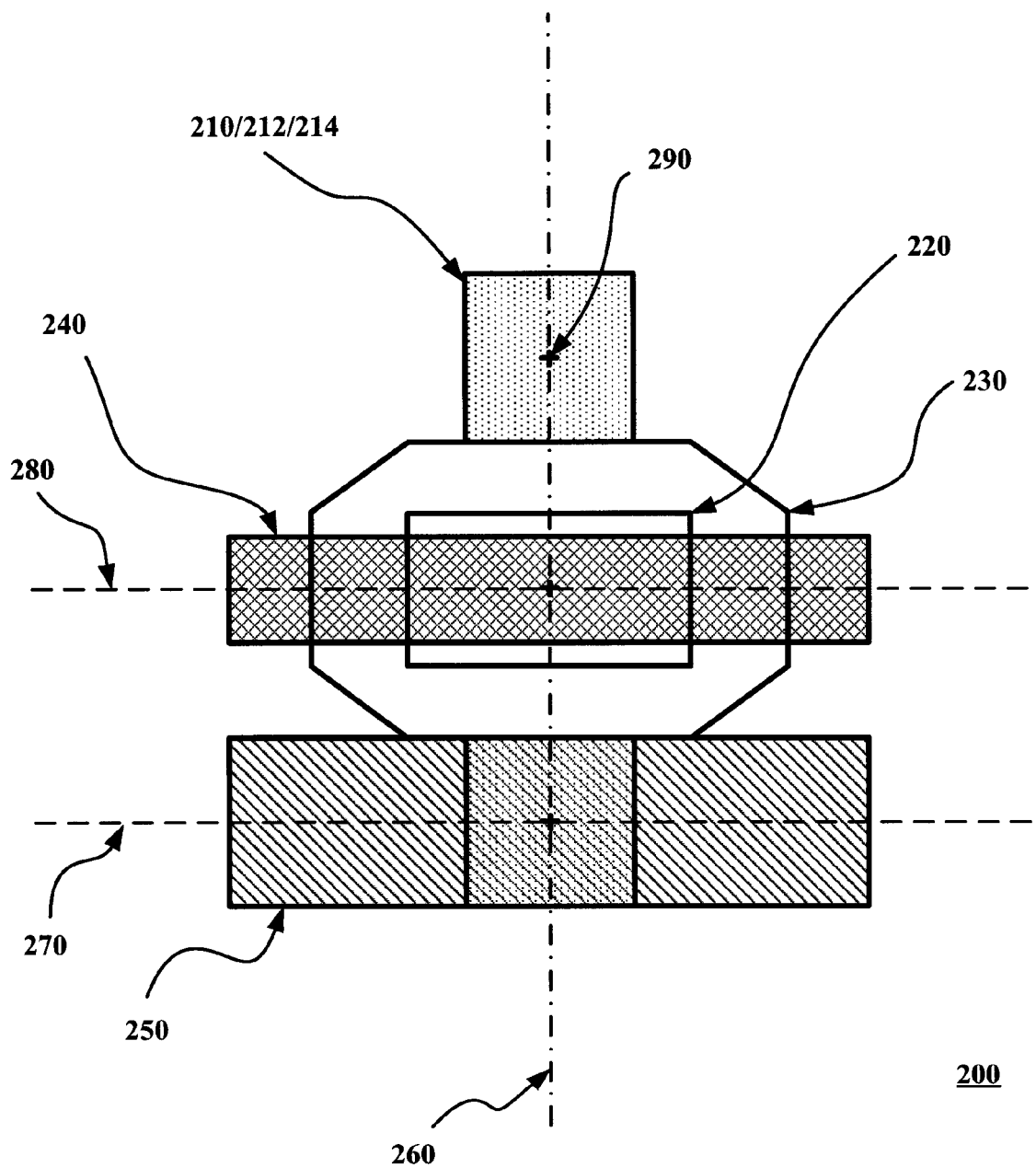
FIG. 5 is a partial top down view of a symmetric STT-MRAM bit cell design.
Figure 6:
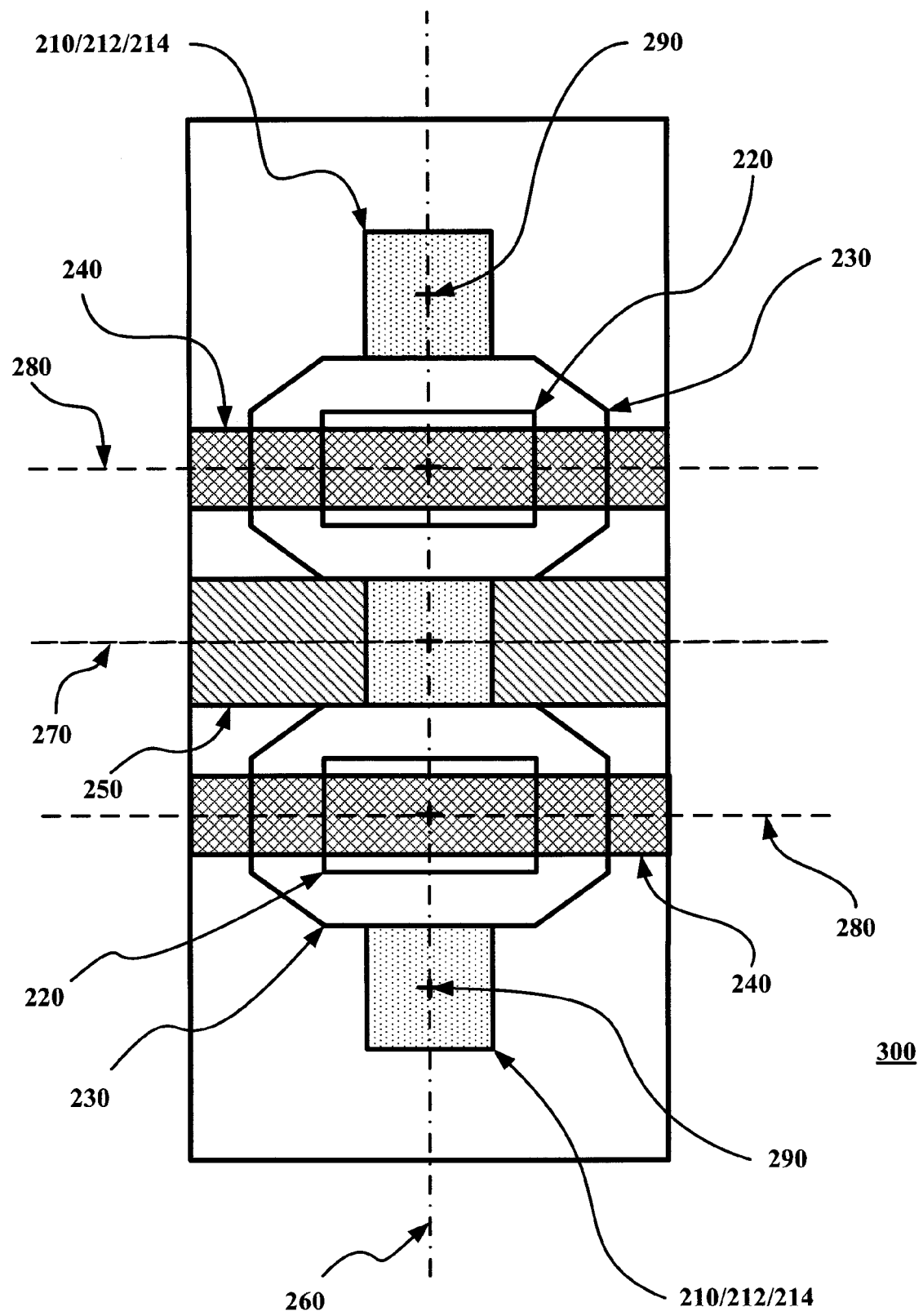
FIG. 6 is a partial top down view of a symmetric STT-MRAM bit cell array.

The symmetry of a single-cell STT-MRAM bit cell 200 and a STT-MRAM bit cell array 300, according to the exemplary embodiments shown in FIGS. 2-4, is further illustrated in FIGS. 5 and 6.

FIG. 5 illustrates a partial top down view of an exemplary single-cell STT-MRAM bit cell 200, in which the storage element 220 and bottom electrode (BE) plate 230 are symmetric along a center line 280 of the poly silicon layer 240. In an example, the storage element 220 and bottom electrode (BE) plate 230 also are symmetric along a longitudinal axis 260 that is perpendicular to the center line 280 of the poly silicon layer 240.

FIG. 6 illustrates a partial top down view of an exemplary Spin Transfer Torque Magnetoresistive Random Access Memory (STT-MRAM) bit cell array 300 (e.g., a two-cell STT-MRAM bit cell array), in which each of the STT-MRAM bit cells 200 are symmetric along the respective center lines 280 of the poly silicon layers 240. The STT-MRAM bit cells 200 also are arranged on a longitudinal axis 260 that is perpendicular to a longitudinal axis 270 of the source line 250 and on opposite sides of the source line 250. As shown in FIG. 6, the STT-MRAM bit cells 200 are symmetrically arranged with respect to the longitudinal axis 270 of the source line 250.

As further illustrated in FIG. 6, the STT-MRAM bit cells 200 include a storage element seed, a contact, and a via interconnect 210/212/214. In another embodiment, the center point 290 of each of the storage element seed, the contact, and the via interconnect 210/212/214 are matched to provide additional symmetry.

Figure 7:
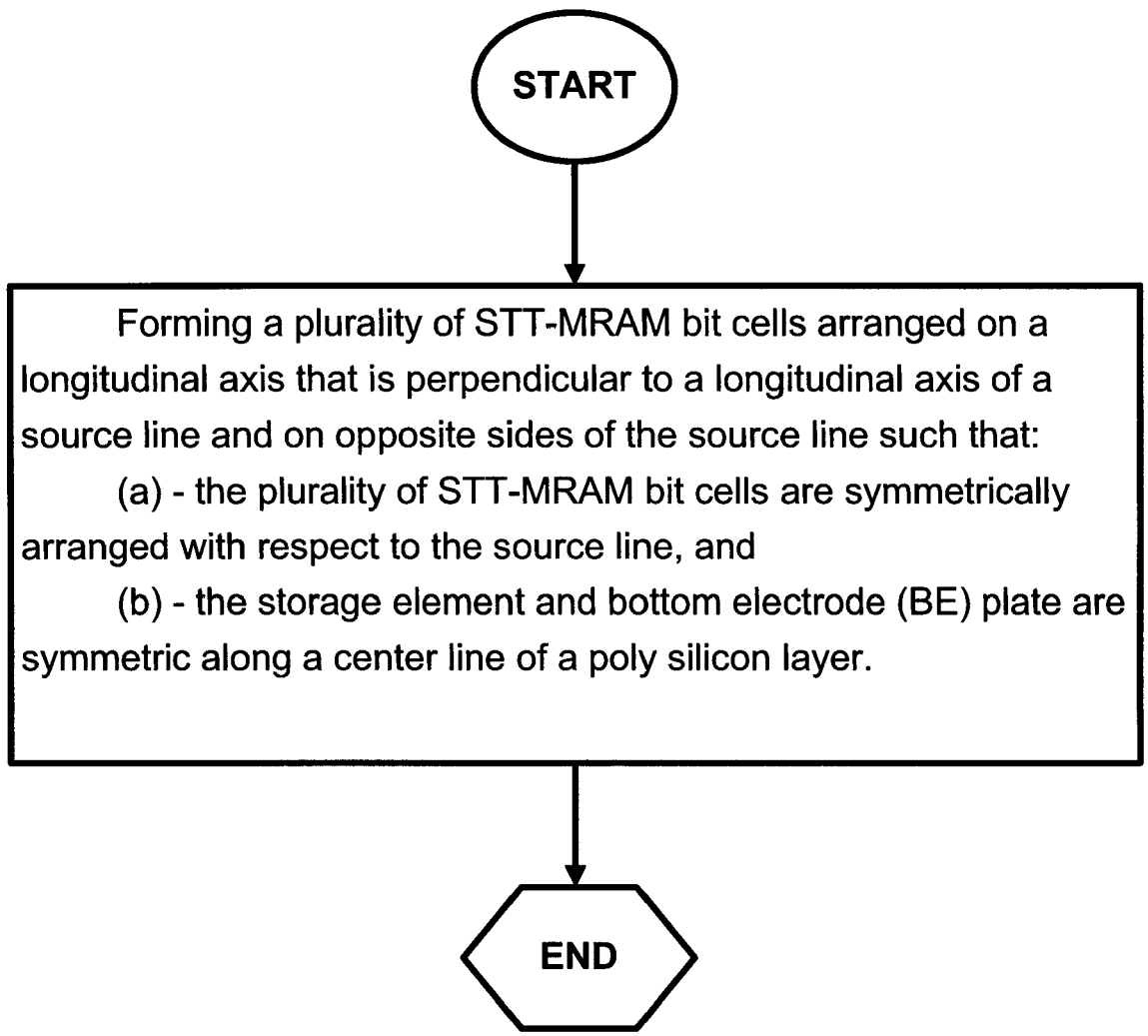
FIG. 7 is flowchart showing a method of forming a symmetric STT-MRAM bit cell design.

With reference to FIG. 7, a method of forming a symmetric STT-MRAM bit cell array includes forming a plurality of symmetric STT-MRAM bit cells arranged on a longitudinal axis that is perpendicular to a longitudinal axis of the source line and on opposite sides of the source line such that the plurality of STT-MRAM bit cells 200 are symmetrically arranged with respect to the source line (step 710). Each of the symmetric STT-MRAM bit cells is formed by providing a poly silicon layer, a magnetic tunnel junction (MTJ) storage element, and a bottom electrode (BE) plate. The storage element and bottom electrode (BE) plate are formed to be symmetric along a center line of the poly silicon layer.

According to the exemplary embodiments illustrated in FIGS. 2-7, a symmetric STT-MRAM bit cell design is provided, in which:

1. the MTJ storage element and hexagonal bottom electrode (BE) plate are symmetric along a center line of the poly silicon; and/or
2. the center of the MTJ seed, contact, and vias are matched.

In an example, this symmetric STT-MRAM bit cell design, in which the MTJ storage element and hexagonal bottom electrode (BE) plate are symmetric along a center line of the poly silicon, and/or the center of the MTJ seed, contact, and vias are matched, improves the design of an STT-MRAM bit cell array structure because of the symmetry. In a example, the symmetric STT-MRAM bit cell design is more area efficient and/or reduces average STT-MRAM bit cell sizes. In an example, the symmetric STT-MRAM bit cell design reduces the mismatch of paired STT-MRAM bit cells. In an example, the symmetric STT-MRAM bit cell design also improves MTJ resistance distribution.

In another embodiment, a symmetric STT-MRAM bit cell array design is provided, in which the overall arrangement also is symmetric to the source line. According to the exemplary embodiments illustrated in FIGS. 2-7, a symmetric STT-MRAM bit cell array design is provided, in which:

1. the MTJ storage element and hexagonal bottom electrode (BE) plate are symmetric along a center line of the poly silicon; and/or
2. the MTJ storage element and hexagonal bottom electrode (BE) plate are symmetric along a center line of the poly silicon layer; and/or
3. the center of the MTJ seed, contact, and vias are matched.

In an example the symmetric STT-MRAM bit cell array design makes the design of an MTJ array structure, such as a large array, easier and/or more area efficient and/or is effective for reducing average STT-MRAM bit cell sizes. In an example, a symmetric STT-MRAM bit cell design also reduces mismatch in pairs of STT-MRAM bit cell and/or improves MTJ resistance distribution, particularly in an array design in which a source line (SL) is parallel to a bit line.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A symmetric Spin Transfer Torque Magnetoresistive Random Access Memory (STT-MRAM) bit cell comprising:
    a poly silicon layer;
    a storage element; and
    a bottom electrode (BE) plate,
    wherein the storage element and bottom electrode (BE) plate are symmetric along a center line of the poly silicon layer.

2. The STT-MRAM bit cell of claim 1, wherein the bottom electrode is a hexagonal bottom electrode.

3. The STT-MRAM bit cell of claim 1, wherein the storage element is a magnetic tunnel junction (MTJ) storage element.

4. The STT-MRAM bit cell of claim 1, further comprising:
    a word line; and
    a word line transistor coupled to the storage element.

5. The STT-MRAM bit cell of claim 4, wherein the word line transistor is coupled in series with the storage element.

6. The STT-MRAM bit cell of claim 1, further comprising:
    a storage element seed;
    a contact; and
    a via interconnect,
    wherein a center point of each of the storage element seed, the contact, and the via interconnect are matched.

7. A symmetric Spin Transfer Torque Magnetoresistive Random Access Memory (STT-MRAM) bit cell array comprising:
    a source line; and
    a plurality of STT-MRAM bit cells arranged on a longitudinal axis that is perpendicular to a longitudinal axis of the source line and on opposite sides of the source line, wherein the plurality of STT-MRAM bit cells are symmetrically arranged with respect to the source line, and wherein each of the STT-MRAM bit cells includes:
        a poly silicon layer;
        a magnetic tunnel junction (MTJ) storage element; and
        a bottom electrode (BE) plate,
        wherein the storage element and bottom electrode (BE) plate are symmetric along a center line of the poly silicon layer.

8. The STT-MRAM bit cell array of claim 7, wherein the bottom electrode is a hexagonal bottom electrode.

9. The STT-MRAM bit cell array of claim 7, wherein each of the STT-MRAM bit cells further comprises:
    a word line; and
    a word line transistor coupled to the storage element.

10. The STT-MRAM bit cell array of claim 9, wherein the word line transistor is coupled in series with the storage element.

11. The STT-MRAM bit cell array of claim 7, further comprising:
    a storage element seed;
    a contact; and
    a via interconnect;
    wherein a center point of each of the storage element seed, the contact, and the via interconnect are matched.

12. A method of forming a symmetric Spin Transfer Torque Magnetoresistive Random Access Memory (STT-MRAM) bit cell array, the method comprising:
    forming a plurality of STT-MRAM bit cells arranged on a longitudinal axis that is perpendicular to a longitudinal axis of a source line and on opposite sides of the source line such that the plurality of STT-MRAM bit cells are symmetrically arranged with respect to the source line, wherein each of the STT-MRAM bit cells includes:
    a poly silicon layer;
    a magnetic tunnel junction (MTJ) storage element; and
    a bottom electrode (BE) plate,
    wherein the storage element and bottom electrode (BE) plate are symmetric along a center line of the poly silicon layer.

13. The method of claim 12, further comprising:
    forming a storage element seed, a contact, and a via interconnect such that a center point of each of the storage element seed, the contact, and the via interconnect are matched.

14. The STT-MRAM bit cell of claim 1, wherein the storage element and the bottom electrode (BE) plate are symmetric along a longitudinal axis extending perpendicular to the center line of the poly silicon layer.

15. The STT-MRAM bit cell of claim 6, wherein the storage element and the bottom electrode (BE) plate are symmetric along a longitudinal axis extending perpendicular to the center line of the poly silicon layer.

16. The STT-MRAM bit cell of claim 15, wherein the storage element seed, the contact, and the via interconnect are matched symmetrically with said longitudinal axis.

17. The STT-MRAM bit cell of claim 7, wherein the center line of the poly silicon layer is perpendicular to the longitudinal axis of the plurality of STT-MRAM bit cells.

18. The STT-MRAM bit cell of claim 7, wherein the center line of the poly silicon layer is perpendicular to the longitudinal axis of the plurality of STT-MRAM bit cells.

19. The STT-MRAM bit cell of claim 18, wherein at least one of the plurality of STT-MRAM bit cells is arranged symmetric to the longitudinal axis of the plurality of STT-MRAM bit cells.

20. The STT-MRAM bit cell of claim 11, wherein at least one of the plurality of STT-MRAM bit cells is arranged symmetric to the longitudinal axis of the plurality of STT-MRAM bit cells.

21. The STT-MRAM of claim 20, wherein the storage element and the bottom electrode (BE) plate of the at least one of the plurality of STT-MRAM bit cells is symmetric along said longitudinal axis of the plurality of STT-MRAM bit cells.

22. The STT-MRAM of claim 21, wherein the storage element seed, the contact, and the via interconnect are matched symmetrically with said longitudinal axis of the plurality of STT-MRAM bit cells.

23. The method of claim 12, wherein forming at least one of the plurality of STT-MRAM bit cells includes forming the storage element and the bottom electrode (BE) plate of the at least one STT-MRAM bit cell symmetric along a longitudinal axis extending perpendicular to the center line of the poly silicon layer.

24. The method of claim 23, wherein forming the at least one of the plurality of STT-MRAM cells further comprises: forming a storage element seed, a contact, and a via interconnect such that a center point of each of the storage element seed, the contact, and the via interconnect are matched.

25. The method of claim 24, wherein forming the storage element seed, the contact, and the via interconnect forms the match symmetric with said longitudinal axis of the plurality of STT-MRAM bit cells.

* * * * *